(12) United States Patent
Lasserre et al.

(10) Patent No.: US 11,361,472 B2
(45) Date of Patent: Jun. 14, 2022

(54) METHODS AND DEVICES FOR NEIGHBOURHOOD-BASED OCCUPANCY PREDICTION IN POINT CLOUD COMPRESSION

(71) Applicant: BlackBerry Limited, Waterloo (CA)

(72) Inventors: Sébastien Lasserre, Thorigné-Fouillard (FR); David Flynn, Darmstadt (DE)

(73) Assignee: BlackBerry Limited, Waterloo (CA)

(*) Notice: Subject to any disclaimer, the term of this patent is extended or adjusted under 35 U.S.C. 154(b) by 0 days.

(21) Appl. No.: 17/258,802

(22) PCT Filed: Jul. 8, 2019

(86) PCT No.: PCT/CA2019/050937
§ 371 (c)(1),
(2) Date: Jan. 8, 2021

(87) PCT Pub. No.: WO2020/010444
PCT Pub. Date: Jan. 16, 2020

(65) Prior Publication Data
US 2021/0272324 A1    Sep. 2, 2021

(30) Foreign Application Priority Data
Jul. 10, 2018   (EP) .................................... 18305926

(51) Int. Cl.
*G06T 9/00* (2006.01)
*G06F 1/03* (2006.01)
(Continued)

(52) U.S. Cl.
CPC ................ *G06T 9/001* (2013.01); *G06F 1/03* (2013.01); *G06T 9/40* (2013.01); *G06T 17/205* (2013.01)

(58) Field of Classification Search
None
See application file for complete search history.

(56) References Cited

U.S. PATENT DOCUMENTS

| 11,051,024 B1 * | 6/2021 | Lasserre .............. H04N 19/147 |
| 2003/0214502 A1 | 11/2003 | Park et al. |

(Continued)

FOREIGN PATENT DOCUMENTS

EP    3553745 A1    10/2019

OTHER PUBLICATIONS

WIPO: International Search Report and Written Opinion relating to application No. PCT/CA2019/050937, dated Aug. 22, 2019.
(Continued)

*Primary Examiner* — Anand P Bhatnagar
(74) *Attorney, Agent, or Firm* — Rowand LLP

(57) ABSTRACT

Methods and devices for encoding a point cloud, where occupancy data for child sub-volumes is context-adaptively encoded based on contexts selected, at least in part, using an occupancy score determined for each child sub-volume. The occupancy score for each child sub-volume of a parent sub-volume is determined based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume.

22 Claims, 14 Drawing Sheets

(51) Int. Cl.
*G06T 9/40* (2006.01)
*G06T 17/20* (2006.01)

(56) References Cited

U.S. PATENT DOCUMENTS

| | | | |
|---|---|---|---|
| 2017/0347100 A1* | 11/2017 | Chou | H03M 7/3059 |
| 2019/0156520 A1* | 5/2019 | Mammou | G06T 1/00 |
| 2020/0396489 A1* | 12/2020 | Flynn | H03M 7/405 |
| 2021/0004992 A1* | 1/2021 | Flynn | G06T 17/10 |
| 2021/0006833 A1* | 1/2021 | Tourapis | H04N 19/20 |
| 2021/0192797 A1* | 6/2021 | Lasserre | G06T 9/001 |
| 2021/0192798 A1* | 6/2021 | Lasserre | G06T 9/40 |
| 2021/0258610 A1* | 8/2021 | Iguchi | G06T 9/00 |

OTHER PUBLICATIONS

Garcia et al.: "Intra-Frame Context-Based Octree Coding for Point-Cloud Geometry", 2018 25th IEEE International Conference on Image Processing (ICIP), pp. 1807-1811, ISBN: 978-1-4799-7061-2; ISSN: 2381-8549; DOI: 10.1109/ICIP.2018.8451802, Oct. 2018.
EPO: Extended European Search Report, relating to EP application No. 18305926.0, dated Jan. 20, 2019.
Hornung et al.: "OctoMap: an efficient probabilistic 3D mapping framework based on octrees", Autonomous Robots, vol. 34, No. 3, pp. 189-206, XP055147395, dated Feb. 7, 2013.
Wikipedia: "Context-adaptive binary arithmetic coding", XP002787808, retrieved from the internet: URL: https://en.wikipedia.org/w/index.php?title=Context-adaptive_binary_arithmetic_coding&oldid=795182792, dated Aug. 12, 2017.
EPO: EP Office Action relating to EP application No. 18305926.0, dated Oct. 22, 2020.

* cited by examiner $$H(b_0, b_1, b_2, \ldots b_7 | N)$$

$$H(b_0 | N)\; H(b_1 | N, b_0)\; H(b_2 | N, b_0 b_1) \ldots H(b_7 | N, b_0 b_1 b_2 \ldots b_6)$$

```
int w[8 * 26] = {
                    125,39,113,42,74,15,67,18
                    ,110,118,68,82,38,43,17,26
                    ,48,120,44,98,29,71,26,58
                    ,126,28,120,22,75,12,65,3
                    ,113,113,102,106,33,37,24,28
                    ,30,127,27,111,14,66,11,56
                    ,103,30,124,36,72,20,83,24
                    ,86,79,114,111,32,30,43,45
                    ,37,118,34,122,18,66,17,66
                    ,124,16,105,16,116,11,93,11
                    ,97,98,58,63,90,92,48,55
                    ,19,126,12,89,14,109,7,74
                    ,116,1,125,3,123,2,124,0
                    ,0,123,2,121,3,125,1,115
                    ,76,8,111,15,91,11,128,19
                    ,55,47,93,89,64,57,99,97
                    ,12,93,12,115,15,104,15,124
                    ,66,16,67,18,124,34,118,37
                    ,44,41,31,30,111,114,79,86
                    ,24,82,20,71,37,124,31,103
                    ,57,9,65,13,113,26,128,32
                    ,27,22,36,31,107,102,113,114
                    ,3,64,13,73,23,119,29,125
                    ,58,24,71,28,100,44,122,49
                    ,26,16,43,37,83,69,119,111
                    ,18,66,15,73,42,113,38,125
                };
``` child i neighbour k

FIG. 12

350 number of occupied
neighbours $N_O$

```
const int LUT_th0[27] = { 47, 47, 47, 47, 47, 47, 47, 47, 47, 47, 47, 60, 57, 57, 57, 57, 57, 57, 57, 57, 57, 57, 57, 57, 57, 57, 57 };
const int LUT_th1[27] = { 66, 66, 66, 66, 66, 66, 66, 66, 66, 66, 66, 68, 68, 63, 64, 62, 62, 62, 62, 62, 62, 62, 62, 62, 62, 62, 62 };
```

FIG. 14

METHODS AND DEVICES FOR NEIGHBOURHOOD-BASED OCCUPANCY PREDICTION IN POINT CLOUD COMPRESSION

FIELD

The present application generally relates to point cloud compression and, in particular to methods and devices for estimating or predicting point cloud occupancy based on occupancy information from neighbouring sub-volumes.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds. Such methods may result in savings in storage requirements (memory) through improved compression, or savings in bandwidth for transmission of compressed data, thereby resulting in improved operation of 3D vision systems, such as for automotive applications, or improved speed of operation and rendering of virtual reality systems, as examples.

BRIEF DESCRIPTION OF THE DRAWINGS

Reference will now be made, by way of example, to the accompanying drawings which show example embodiments of the present application, and in which:

FIG. 12 shows an example look-up table of weights;

FIG. 14 shows an example look-up table of thresholds for determining prediction status;

Similar reference numerals may have been used in different figures to denote similar components.

DESCRIPTION OF EXAMPLE EMBODIMENTS

Figure 1:
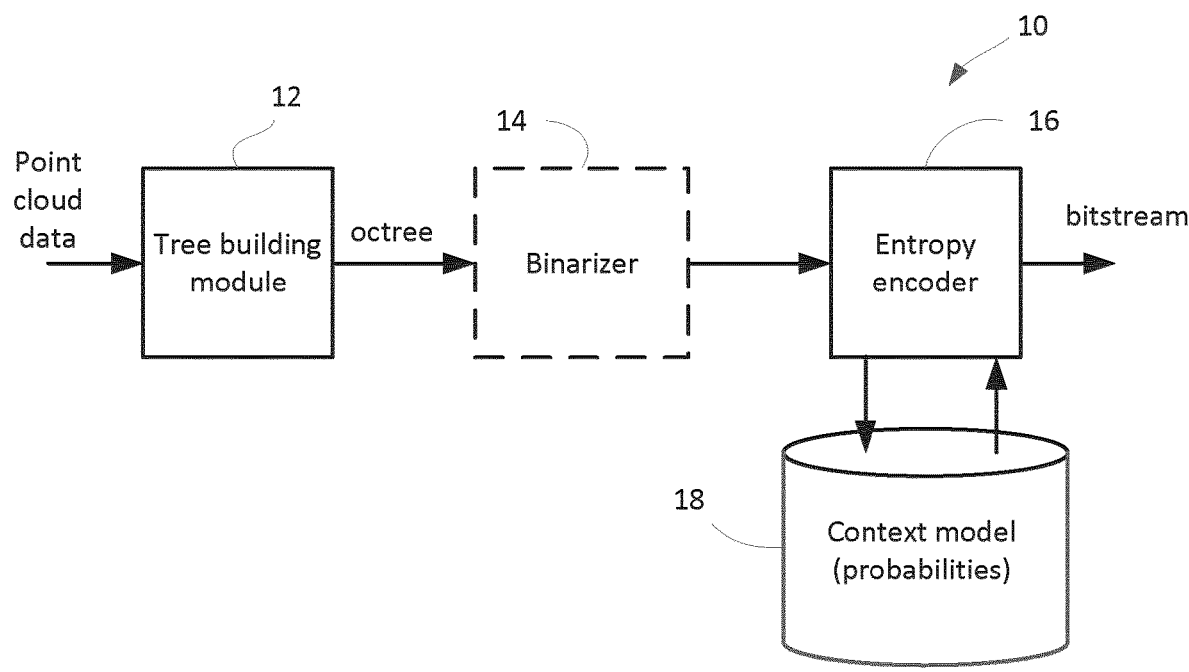
FIG. 1 shows a simplified block diagram of an example point cloud encoder.

The present application describes methods of encoding and decoding point clouds, and encoders and decoders for encoding and decoding point clouds. The occupancy data for child sub-volumes is context-adaptively coded based on contexts selected, at least in part, using an occupancy score determined for each child sub-volume. The occupancy score for each child sub-volume of a parent sub-volume is determined based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume.

In one aspect, the present application describes method of encoding a point cloud to generate a bitstream of compressed point cloud data representing a three-dimensional location of a physical object, the point cloud being located within a volumetric space recursively split into sub-volumes and containing points of the point cloud, each of the points having a geometric location within the volumetric space, wherein an occupancy bit associated with each respective sub-volume indicates whether that respective sub-volume contains at least one of the points. The method includes determining an occupancy score for each child sub-volume of a parent sub-volume, where each occupancy score is based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume; for each child sub-volume of the parent sub-volume, context-adaptively entropy encoding occupancy data for the child sub-volume based, at least in part, on its occupancy score to generate a bitstream; and outputting the bitstream of compressed point cloud data.

In another aspect, the present application describes a method of decoding a bitstream of compressed point cloud data to produce a reconstructed point cloud representing a three-dimensional location of a physical object, the point cloud being located within a volumetric space recursively split into sub-volumes and containing the points of the point cloud, each of the points having a geometric location within the volumetric space, wherein an occupancy bit associated with each respective sub-volume indicates whether that respective sub-volume contains at least one of the points. The method includes reconstructing the points of the point cloud by reconstructing the occupancy bits by determining an occupancy score for each child sub-volume of a parent sub-volume, where each occupancy score is based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume; for each child sub-volume of the parent sub-volume, context-adaptively entropy decoding the bitstream based, at least in part, on the occupancy score for that child sub-volume to reconstruct the occupancy data for that child sub-volume; and outputting the reconstructed point cloud.

In some implementations, the method may include determining an occupancy score includes summing the respective weights of each of the neighbouring sub-volumes that is occupied to obtain a sum, and dividing the sum by the number of neighbouring sub-volumes.

In some implementations, determining the occupancy score may include determining the occupancy score based on $$score_i = \frac{1}{N}\sum_{k=1}^{N} w_{k,i}(\delta_k),$$

where i is an index to the child sub-volumes, $score_i$ is the occupancy score for the i-th child sub-volume, k is an index to the neighbouring sub-volumes, N is a total number of neighbouring sub-volumes, $w_{k,j}$ is the respective weight assigned to the k-th neighbouring sub-volume vis-à-vis the i-th child sub-volume, and $\delta_k$ is an occupancy status of the k-th neighbouring sub-volume that is 0 if the k-th neighbouring sub-volume is unoccupied and is 1 if the k-th neighbouring sub-volume is occupied.

In some implementations determining the occupancy score may include obtaining the respective weights from a weights look-up table stored in memory.

In some implementations context-adaptively entropy encoding occupancy data for the child sub-volume ma include selecting a context, based on the occupancy score for that child sub-volume, for coding the occupancy bit associated with that child sub-volume, and context-adaptively entropy coding that occupancy bit based on the selected context to generate the bitstream. Similarly, in some implementations, context-adaptively entropy decoding the bitstream may include selecting a context, based on the occupancy score for that child sub-volume, for decoding the occupancy bit associated with that child sub-volume, and context-adaptively entropy decoding that occupancy bit based on the selected context to the occupancy bit. In some such implementations, selecting a context includes selecting a context set from among two or more available mutually-exclusive context sets based upon the occupancy score, each of the two or more available mutually-exclusive context sets containing two or more contexts, and then selecting the context from the selected context set. And in some of those implementations, selecting the context from the selected context set may include selecting the context based on neighbour configuration.

In some implementations, determining an occupancy score for each child sub-volume may include determining a prediction status for each child sub-volume, and wherein the prediction statuses include occupied, unoccupied, or no-prediction, and wherein, for each child sub-volume, selecting a context includes selecting a context set from among two or more available mutually-exclusive context sets based upon the prediction status determined for that child sub-volume. In some of those cases, determining a prediction status may include comparing the occupancy score to a lower threshold and to an upper threshold, and wherein the prediction status is determined to be occupied if the occupancy score is above the upper threshold, is determined to be unoccupied if the occupancy score is below the lower threshold, and is determined to be no-prediction otherwise, and optionally, further including selecting the upper and lower thresholds based upon the number of neighbouring sub-volumes that are occupied, and optionally, further including obtaining the upper and lower thresholds from a thresholds look-up table stored in memory.

In some implementations, the plurality of neighbouring sub-volumes neighbouring the parent sub-volume may include sub-volumes that share a face, an edge or a vertex with the parent sub-volume.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

At times in the description below, the terms "node", "volume" and "sub-volume" may be used interchangeably. It will be appreciated that a node is associated with a volume or sub-volume. The node is a particular point on the tree that may be an internal node or a leaf node. The volume or sub-volume is the bounded physical space that the node represents. The term "volume" may, in some cases, be used to refer to the largest bounded space defined for containing the point cloud. A volume may be recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality systems, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point cloud data is useful, a lack of effective and efficient compression, i.e. encoding and decoding processes, may hamper adoption and deployment. A particular challenge in coding point clouds that does not arise in the case of other data compression, like audio or video, is the coding of the geometry of the point cloud. Point clouds tend to be sparsely populated, which makes efficiently coding the location of the points that much more challenging.

One of the more common mechanisms for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The partitioning of a volume is not necessarily into two sub-volumes (KD-tree) or eight sub-volumes (octree), but could involve other partitions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where occupancy implies splitting, with the constraint that there is a maximum depth or resolution beyond which no further splitting will occur. In this case, a single flag signals whether a node is split and hence whether it is occupied by at least one point, and vice versa. At the maximum depth, the flag signals occupancy, with no further splitting possible.

In some implementations, splitting and occupancy are partially independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.

2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

Like with video or image coding, point cloud coding can include predictive operations in which efforts are made to predict the location of points in a volume. From the predicted locations of points, one can predict the occupancy pattern for a sub-volume. Predictions may be spatial (dependent on previously coded sub-volumes in the same point cloud) or temporal (dependent on previously coded point clouds in a time-ordered sequence of point clouds).

Figure 2:
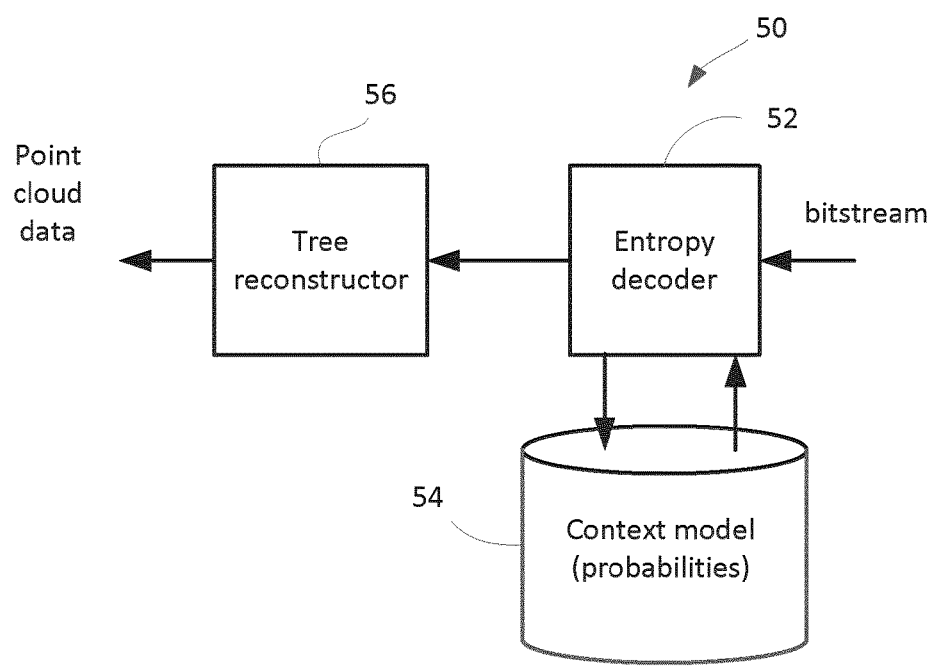
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

Figure 3:
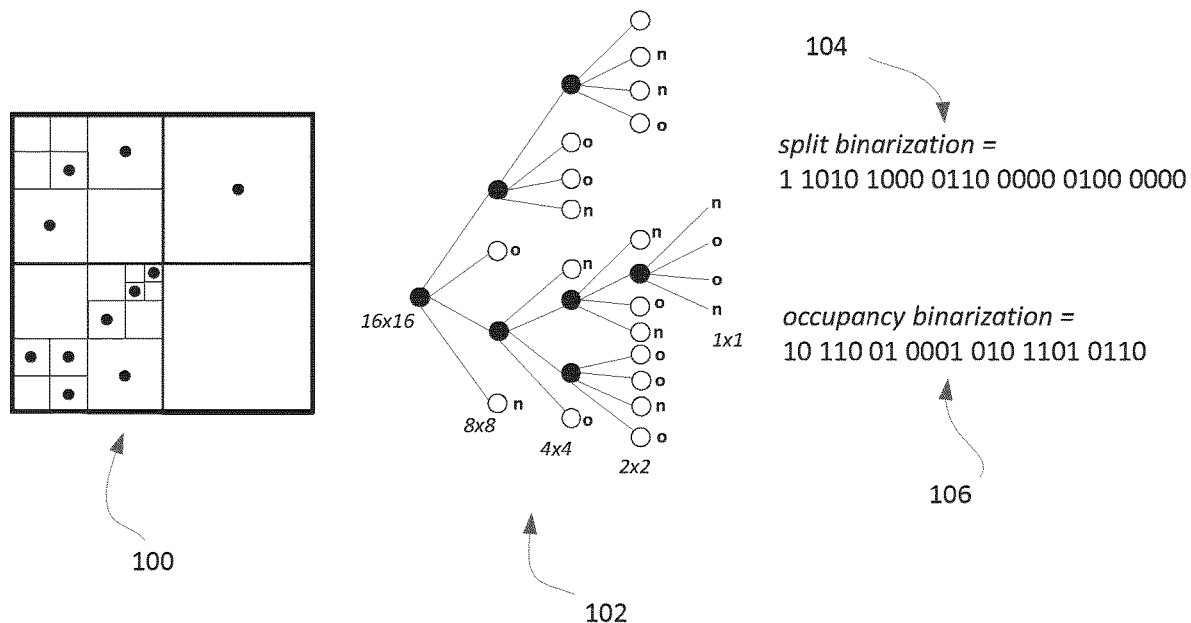
FIG. 3 shows an example partial sub-volume and associated tree structure for coding.

An example partial sub-volume 100 is shown in FIG. 3. In this example, a sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the tree and represent the finest resolution for positional point data. The points from the point cloud are shown as dots in the figure.

The structure of the tree 102 is shown to the right of the sub-volume 100. The sequence of splitting flags 104 and the corresponding sequence of occupancy flags 106, obtained in a pre-defined breadth-first scan order, is shown to the right of the tree 102. It will be observed that in this illustrative example, there is an occupancy flag for each sub-volume (node) that is not split, i.e. that has an associated splitting flag set to zero. These sequences may be entropy encoded. This is an example of a "split-then-occupied" type of tree.

Figure 4:
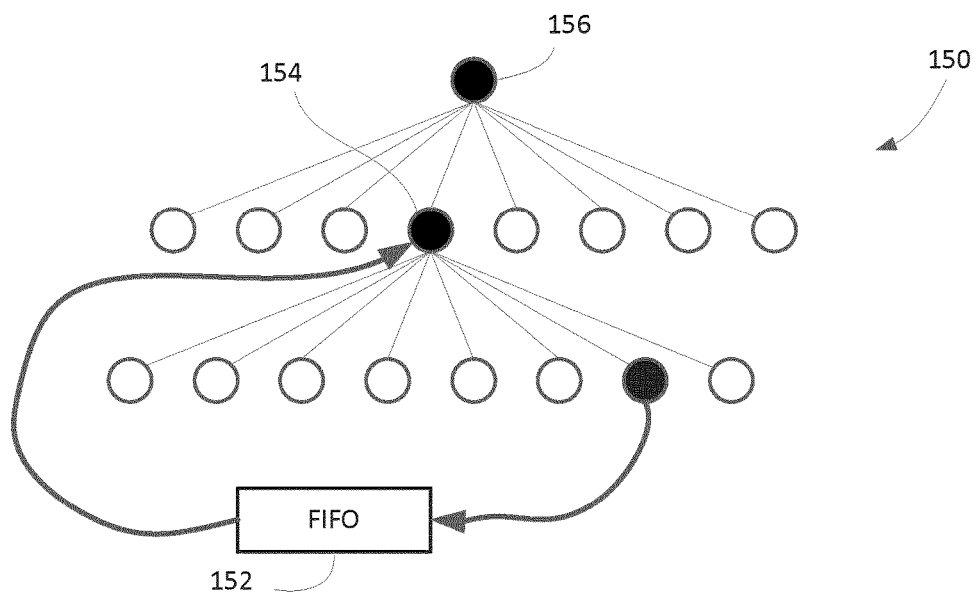
FIG. 4 illustrates the recursive splitting and coding of an octree.

Another example, which employs an occupied =splitting condition, is shown in FIG. 4. FIG. 4 illustrates the recursive splitting and coding of an octree 150. Only a portion of the octree 150 is shown in the figure. A FIFO 152 is shown as processing the nodes for splitting to illustrate the breadth-first nature of the present process. The FIFO 152 outputs an occupied node 154 that was queued in the FIFO 152 for further splitting after processing of its parent node 156. The tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the tree).

Figure 5:
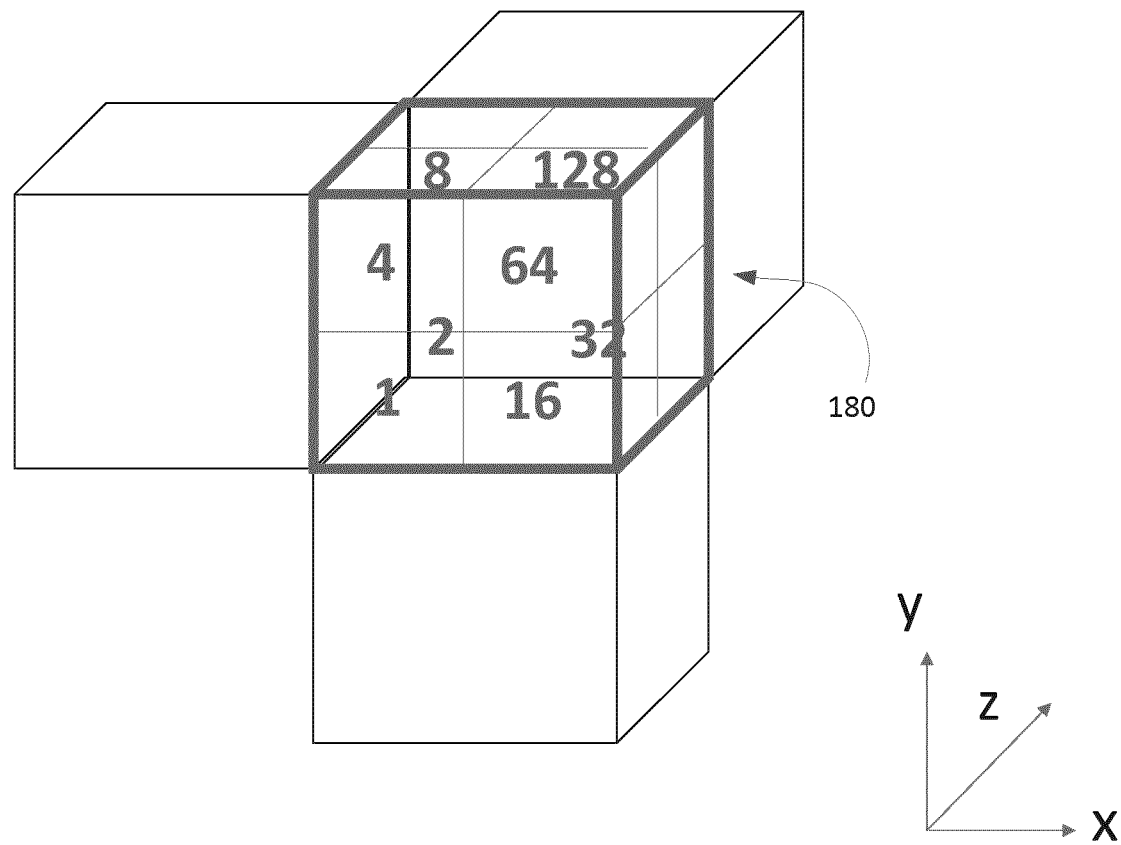
FIG. 5 shows an example scan pattern within an example cube from an octree.

Reference is now made to FIG. 5, which shows an example cube 180 from an octree. The cube 180 is subdivided into eight sub-cubes. The scan order for reading the flags results in an eight bit string, which can be read as an integer [1, 255] in binary. Based on the scan order and the resulting bit position of each sub-cube's flag in the string, the sub-cubes have the values shown in FIG. 5. The scan order may be any sequence of the sub-cubes, provided both the encoder and decoder use the same scan order.

Figure 6:
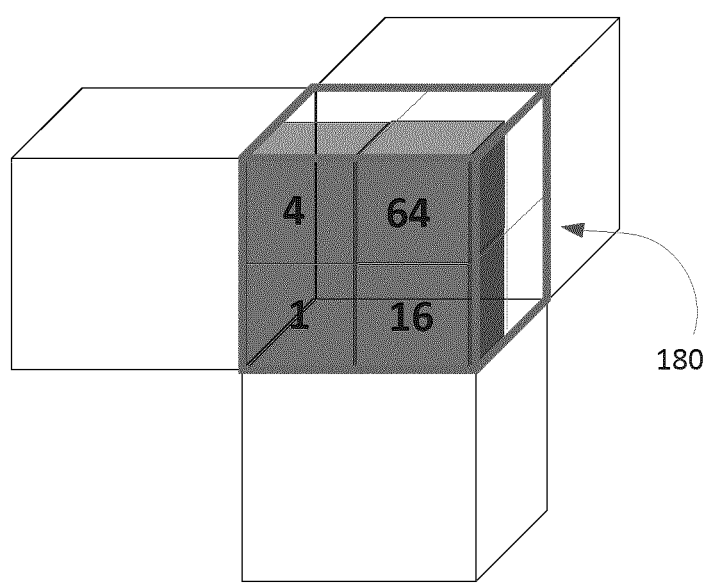
FIG. 6 shows an example occupancy pattern within an example cube.

As an example, FIG. 6 shows the cube 180 in which the four "front" sub-cubes are occupied. This would correspond to pattern 85, on the basis that the sub-cubes occupied are cubes 1+4+16+64. The integer pattern number specifies the pattern of occupancy in the sub-cubes.

In European patent application no. 18305037.6, the present applicants described methods and devices for selecting among available pattern distributions to be used in coding a particular node's pattern of occupancy based on some occupancy information from previously-coded nodes near the particular node. In one example implementation, the occupancy information is obtained from the pattern of occupancy of the parent to the particular node. In another example implementation, the occupancy information is obtained from one or more nodes neighbouring the particular node. The contents of European patent application no. 18305037.6 are incorporated herein by reference. This is referred to as determining a "neighbour configuration", and selecting a context (i.e. a pattern distribution) at least partly based on the neighbour configuration.

Figure 7:
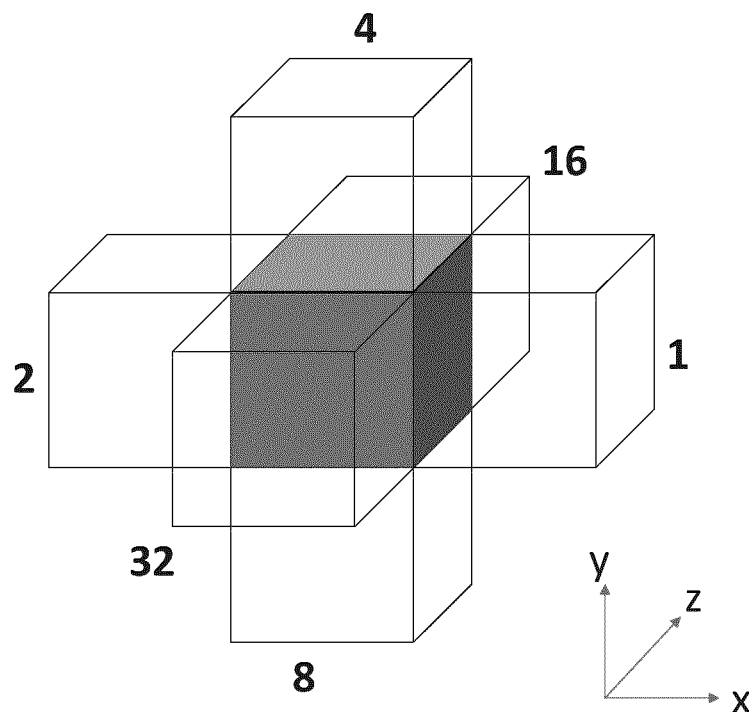
FIG. 7 shows an example of neighbouring sub-volumes.

FIG. 7 illustrates a set of neighbors surrounding a current node, where neighbour is defined as nodes sharing a face. In this example, the nodes/sub-volumes are cubes and the cube at the center of the image has six neighbours, one for each face. In an octree, it will be appreciated that neighbours to the current node will include three sibling nodes, i.e. nodes that have the same parent node. It will also include three nodes that do not have the same parent node. Accordingly, occupancy data for some of the neighboring nodes will be available because they are siblings, but occupancy data for some neighbouring nodes may or may not be available, depending on whether those nodes were previously coded. Special handling may be applied to deal with missing neighbours. In some implementations, the missing neighbour may be presumed to be occupied or may be presumed to be unoccupied. It will be appreciated that the neighbour definition may be broadened to include neighbouring nodes based on a shared edge or based on a shared vertex to include additional adjacent sub-volumes in the assessment.

Figure 8:
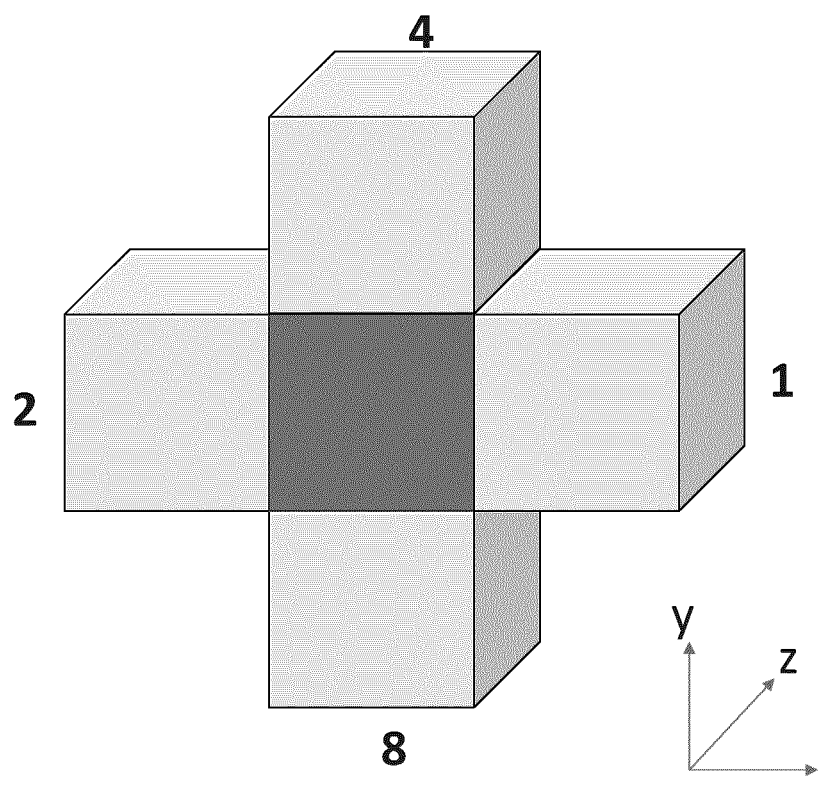
FIG. 8 shows an example neighbour configuration showing occupancy among neighbouring nodes.

The occupancy of the neighbours may be read in a scan order that effectively assigns a value to each neighbour, much like as is described above with respect to occupancy patterns. As illustrated, the neighbouring nodes effectively take values of 1, 2, 4, 8, 16 or 32, and there are therefore 64 (0 to 63) possible neighbour occupancy configurations. This value may be termed the "neighbour configuration" herein. As an example, FIG. 8 illustrates an example of neighbour configuration 15, in which neighbours 1, 2, 4 and 8 are occupied and neighbours 16 and 32 are empty.

In some cases, the number of probability distributions may equal the number of possible occupancy outcomes in the selection criteria. In other words, in the case of a parent pattern for an octree, there would be probability distributions involving 255 probabilities each. In the case of neighbour configuration, if neighbour is defined as sharing a face, there would be 64 probability distributions. However, it will be understood that too many distributions may result in slow adaptation due to scarcity of data, i.e. context dilution. Accordingly, in some embodiments, similar patterns may be grouped so as to use the same probability distribution. For example separate distributions may be used for patterns corresponding to fully occupied, vertically-oriented, horizontally-oriented, mostly empty, and then all other cases. This could reduce the number of probability distributions to about five. It will be appreciated that different groupings of patterns could be formed to result in a different number of probability distributions.

In one variation to the neighbour-based probability distribution selection, the number of distributions may be reduced by exploiting the symmetry of the neighbourhood. By permuting the neighbour configuration or permuting the pattern distribution, structurally similar configurations having a line of symmetry can re-use the same distribution. As a result, the number of neighbour configurations (and thus distribution patterns), may be reduced. In some cases, the 64 neighbour configurations can be reduced using these techniques to 64, 24, 18 or 10 total neighbour configurations. In other words, neighbour configurations that can use the same pattern distribution may be grouped into a class. A class containing more than one neighbour configuration may be referred to herein as a "neighbour configuration" in that one of the neighbour configurations effectively subsumes other neighbour configurations by way of reflection or permutation of those other configurations.

The above-described techniques of using neighbour occupancy information for coding tree occupancy focus on using non-binary entropy coding of the occupancy pattern, where a pattern distribution is selected based on neighbour occupancy information, i.e. neighbour configuration. However, in some instances, the use of binary coders can be more efficient in terms of hardware implementation. Moreover, on-the-fly updates to many probabilities may require fast-access memory and computation within the heart of the arithmetic coder. Accordingly, it may be advantageous to find methods and devices for entropy encoding the occupancy pattern using binary arithmetic coders. It would be advantageous to use binary coders if it can be done without significantly degrading compression performance and while guarding against having an overwhelming number of contexts to track.

The use of binary coders in place of a non-binary coder is reflected in the entropy formula:

$$H(X_1,X_2|Y)=H(X_1|Y)H(X_2|Y,X_1)$$

where $X=(X_1, X_2)$ is the non-binary information to be coded, and Y is the context for coding, i.e. the neighbour configuration or selected pattern distribution. To convert non-binary coding of X into binary coding, the information $(X_1, X_2)$ is split into information $X_1$ and $X_2$ that can be coded separately without increasing the entropy. To do so, one must code one of the two depending on the other, here $X_2$ depending on $X_1$. This can be extended to n bits of information in X. For example, for n=3:

$$H(X_1,X_2,X_3|Y)=H(X_1|Y)H(X_2|Y,X_1)H(X_3|Y,X_1,X_2)$$

It will be understood that as the occupancy pattern, i.e. bit sequence X, gets longer there are more conditions for coding later bits in the sequence. For a binary coder (e.g. CABAC) this means a large increase in the number of contexts to track and manage. Using an octree as an example, where the occupancy pattern is an eight-bit sequence $b=b_0 \ldots b_7$, the bit sequence may be split into the eight binary information bits $b_0 \ldots b_7$. The coding may use the neighbour configuration N (or NC) for determining context. Assuming that we can reduce the neighbour configurations to 10 effective neighbour configurations through grouping of neighbour configurations into classes of invariance, as described above, then N is an integer belonging to $\{0, 1, 2, \ldots, 9\}$. For shorthand, the "classes of invariant neighbour configurations" may be referred to herein, at times, simply as the "neighbour configurations", although it will be appreciated that this reduced number of neighbour configurations may be realized based on the class-based grouping of neighbour configurations based on invariance.

Figure 9:
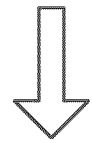
FIG. 9 illustrates the equivalence between non-binary coding and cascaded binary coding for an occupancy pattern.

FIG. 9 illustrates the splitting of an eight-bit pattern or sequence into eight individual bits for binary entropy coding. It will be noted that the first bit of the sequence is encoded based on the neighbour configuration, so there are ten total contexts available. The next bit of the sequence is encoded based on the neighbour configuration and any previously-encoded bits, i.e. bit $b_0$. This involves 20 total available contexts: obtained as the product of 10 from N and 2 from $b_0$. The final bit, $b_7$, is entropy encoded using a context selected from 1280 available contexts: obtained as the product of 10 from N and 128 from the partial pattern given by the previously-encoded bits $b_0, \ldots, b_6$. That is, for each bit the number of contexts (i.e. possible combinations of conditions/dependencies) is the product of the number of neighbour configurations defined (10, in this example, based on grouping of the 64 neighbour configurations into classes), and the number of partial patterns possible from the ordered sequence of n−1 previously-encoded bits (given by $2^{n-1}$).

As a result, there are a total of 2550 contexts to maintain in connection with binary coding of the occupancy pattern. This is an excessively large number of contexts to track, and the relative scarcity may cause poor performance because of context dilution, particularly for later bits in the sequence.

Accordingly, in some cases the encoders and decoders that determine whether the set of contexts can be reduced and, if so, apply a context reduction operation to realize a smaller set of available contexts for entropy coding at least part of an occupancy pattern using a binary coder. In at least some implementations, the context reduction is applied a priori to realize a reduced or smaller set of contexts that are then used by the encoder and decoder based on determining that the context reduction conditions are met. Those conditions may include determining that a neighbour configuration is empty or full, or that the bit being coded is at or above a particular position in the bit sequence, for example.

The context reduction operation reduces the number of available contexts in a set of available contexts to a smaller set containing fewer total contexts. It will be recalled, that the number of available contexts may depend, in part, on the bit position in the sequence, i.e. the index, since the context may depend on a partial pattern of previously-coded bits from the bit sequence. In some implementations, the number of contexts available in the set, before reduction, may be based on the number of neighbour configurations multiplied by the number of partial patterns possible with the previously-coded bits. For a bit at index i, where i ranges from 0 to n, the number of partial patterns may be given by $2^i$.

Example context reduction operations include reducing neighbour configurations for later bits in the bit sequence on the basis that previously-coded bits are associated with sub-volumes that screen or shield (e.g. are positioned in between) one of the neighbouring volumes, meaning the occupancy data provided by the previously-coded bits is more significant and relevant than the occupancy data associated with the shielded volume. Another example context reduction involves special handling of cases such as empty neighbour configurations or completely full neighbour configurations. Such situations may indicate a lack of directionality and, thus, less need to take into account the order of previously-coded bits associated with the sub-volumes. Finally, an example context reduction operation is applying a mapping of a set of contexts to a smaller set of contexts based on determining statistical similarities between pairs of contexts. The statistical similarities may be based on a distance metric between the pairs of contexts. Any such context reduction operations may be used individually or together in combination or sub-combination in some cases to reduce then number of contexts available for binary entropy coding at least some of the bits of an occupancy pattern.

Exploiting Local Spatial Redundancy

In some implementations, the bits of an occupancy pattern occupancy may be arithmetically coded, each in turn. Each bit $b_i$ is representative of the occupancy of a respective child node of the current node (sub-volume), where an ordered string or sequence of bits, $b_0, \ldots, b_7$, is the occupancy pattern for that current node. It has been found that, at least with densely populated point clouds, the information from neighbouring sub-volumes may be useful in predicting the occupancy of child sub-volumes of a current sub-volume. This prediction of occupancy of child nodes can be used to improve compression when coding the bit sequence signaling occupancy of the child nodes. In some cases, by using the prediction of child node occupancy, context selection may be made more accurate, leading to improved arithmetic coding of the bits of the occupancy pattern. In some implementations, the neighbour-based occupancy prediction may be used to steer or drive the arithmetic coder by determining which set of contexts to use for the coding of the occupancy bits and other techniques, such as the neighbour configuration discussed above, may be used for selecting a particular context from the set.

As noted above, the use of more neighbours (neighbour configuration) to drive selection of a non-binary pattern distribution may result in too many pattern distributions that will adapt too slowly. Nevertheless, it may be advantageous in terms of compression performance (improvement in coding rate) to exploit spatial redundancy by using additional neighbour data without unduly increasing coding complexity or hampering context adaptation.

Figure 10:
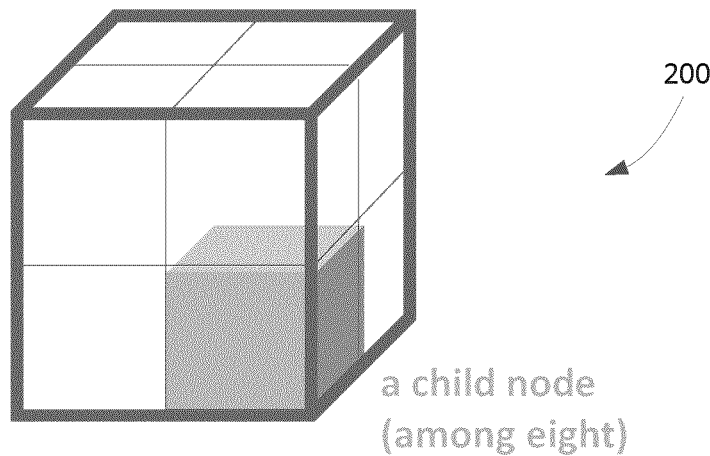
FIG. 10 shows an example of a current sub-volume and its octree-based partitioning into child sub-volumes.

FIG. 10 shows one example of a current sub-volume 200 as represented by a current node in the coding process. Location data for the points of the point cloud within the current sub-volume 200 in this example is coded using a tree-based coding method as described above. In this example, the tree-based coding is octree based. Accordingly, the current sub-volume 200 is subdivided into eight child sub-volumes, each being coded as a child node in the octree coding process.

At the level of the parent sub-volume, i.e. current sub-volume 200, there will be neighbouring sub-volumes. The neighbouring sub-volumes (which may alternatively be termed neighbouring nodes) are nodes that are physically adjacent to the current sub-volume 200. Being that they are in close physical proximity, the occupancy status of the neighbouring sub-volumes has some statistical correlation with the occupancy status of child sub-volumes of the current sub-volume. In some embodiments, the neighbouring sub-volumes are those sub-volumes that share a face, edge or vertex with the current sub-volume. This results in up to 26 neighbouring sub-volumes (there may be fewer in boundary cases).

When predicting the occupancy status of one of the child sub-volumes, each of the neighbouring sub-volumes may have a different degree of correlation in terms of predicting the status of the child sub-volumes. In many cases, the distance between the child sub-volume and the neighbouring sub-volume may be relevant to the degree of correlation. Other factors may influence correlation, such as whether the surfaces of the particular three-dimensional objection being modelled tend to be horizontal or vertical. Each combination of a child sub-volume and a neighbouring sub-volume may be assigned a weight $w_{k,i}$ that represents the degree of, or strength of, correlation in predicting occupancy, where k is an index to the neighbouring sub-volume (typically ranging from 1 to 26) and i is an index to the child sub-volume whose occupancy status is being predicted.

In one example embodiment, the correlation weight of each occupied neighbouring sub-volume is taken into account in determining a likelihood that the child sub-volume is occupied. Those weights may be summed, in some implementations, and averaged over the total number of neighbouring sub-volumes (for instance 26). In another example, the sum may be averaged over the total number of occupied sub-volumes.

Figure 11:
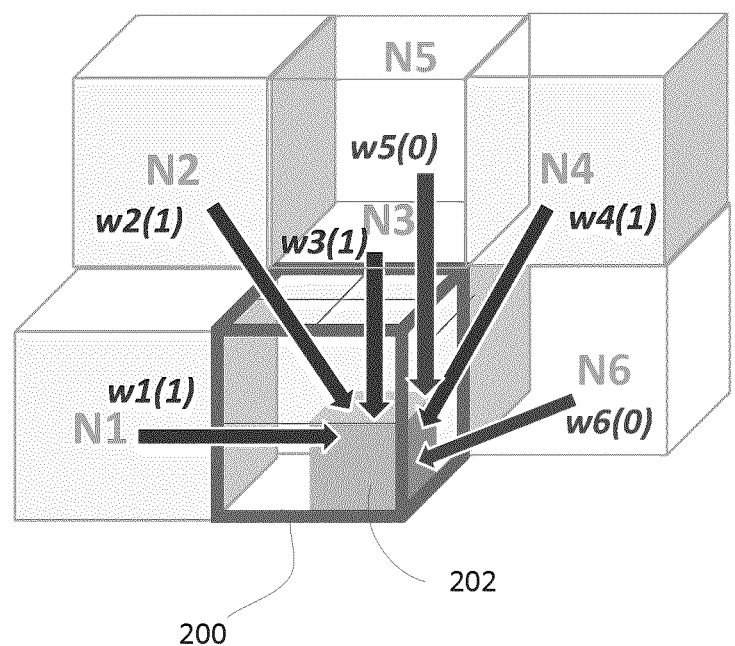
FIG. 11 shows an example in which the current sub-volume has four occupied neighbouring sub-volumes.

FIG. 11 shows an example in which the current sub-volume 200 has four occupied neighbouring sub-volumes, labelled $N_1$, $N_2$, $N_3$, and $N_4$. The example neighbouring sub-volumes labelled $N_5$ and $N_6$ are unoccupied. The twenty other surrounding sub-volumes are not illustrated for ease of readability. A child sub-volume 202 is shown in the front bottom right corner of the current sub-volume 200.

To determine the predicted occupancy of the child sub-volume 202, the encoder may determine a $score_i$, where i is the index of the child sub-volume:

$$score_i = \frac{1}{26}\sum_{k=1}^{26} w_{k,i}(\delta_k)$$

Although in this example, the index of neighbouring sub-volumes k ranges from 1 to 26 and the average is taken over all 26, in some cases, there may be fewer or more neighbouring sub-volumes. The total number of neighbouring sub-volumes may be designated N. In volume boundary cases, where not all sides, edges or vertexes of the parent sub-volume have a neighbouring sub-volume, N may be reduced to a count less than 26 (in the octree case). In some embodiments, the average may still be taken over N, which gives greater influence to the neighbouring sub-volumes available; alternatively, the average may be taken over 26 (or whatever the maximum number of neighbouring sub-volumes is for a given implementation), which effectively means that the missing neighbouring sub-volumes are treated as unoccupied.

The weight, $w_{k,i}$ can be considered to be the conditional probability of the i-th child to be occupied knowing the state (occupied vs non-occupied) of the neighbouring sub-volume k. The parameter $\delta_k$ is 1 if the k-th neighbour is occupied, and is zero otherwise.

The $score_i$ may be referred to herein as a "score", an "occupancy score", a "prediction score", or a "predictive occupancy score", all of which are synonyms.

In one example, the weights $w_{k,i}$ may be determined based on a distance metric between the neighbouring sub-volume k and the child sub-volume i. In one example, the weights are initialized based on the distance metric, but are updated over the course of coding so as to adapt to the content. For example, the encoder and decoder may be configured to track the correlation between neighbour occupancy and child occupancy and periodically update the weights to better reflect the empirical statistical data. The update may be per point cloud in a time series of point clouds, for example; or every F frames (where F>1). In yet another example implementation, the encoder may track the empirical statistical data and may periodically signal changes to the weights to the decoder in the bitstream.

In some cases, the weights may be prescribed in a look-up-table (LUT) at the encoder and decoder. The LUT may or may not be periodically updated based on statistical data collected from the content being coded. One example LUT for an octree-based coding of point clouds is shown in FIG. 12 for some scan order of the neighbours and the children.

The weight $w_{k,i}(1)$ is representative of the probability of the i-th child to be occupied knowing that the neighbour k is occupied, i.e.

$w_{k,i}(1)=P(\text{child } i \text{ occupied}|k \text{ occupied})$.

Similarly, the weight $w_{k,i}(0)$ is representative of the probability of the i-th child to be occupied knowing that the neighbour k is not occupied, i.e.

$w_{k,i}(0)=P(\text{child } i \text{ occupied}|k \text{ not occupied})$.

In the example LUT of FIG. 12, this probability $w_{k,i}(1)$ has been normalized to 128 in order to obtain integer (as opposed to floating point) based computation of the score. Thus, the higher the weight the higher the probability of the child node to be occupied. On the other hand, a very low weight implies that if the neighbour is occupied, then the child node tends not to be. Consequently, child nodes having a high occupancy score tend to be more occupied than those with a low score.

It will be appreciated that the $score_i$ for predicting the occupancy of a child node may be used as a predictor, from which a residual may be obtained (e.g. 0 if correct, and 1 if incorrect). The encoder may then encode the residual rather than the actual occupancy bit. For a current node, this may result in coding a residual occupancy sequence of eight bits rather than the occupancy sequence $b_0, b_1, \ldots, b_7$. This does not reduce the quantity of data being coded, but if the predictor is accurate then the residuals will tend to be mostly zeros, which may result in more efficient context-adaptive coding.

However, in some implementations, coding the residual sequence may not mesh well with improvements to context selection based on neighbouring volumes (neighbour configuration) and/or previously-encoded bits of the bits sequence, both of which are based on exploiting non-random directionality in the occupancy pattern. Accordingly, in some of the embodiments described below the prediction, i.e. the occupancy score, determined from neighbouring sub-volumes may be used to improve context selection, instead of being used find a residual by XOR'ing its predicted bit with the occupancy bit.

In one example implementation, the score for a given child sub-volume is used to directly index a context for coding the occupancy bit associated with that child sub-volume. That is, the context for coding the occupancy bit is selected directly based on the score for that child node.

Figure 13:
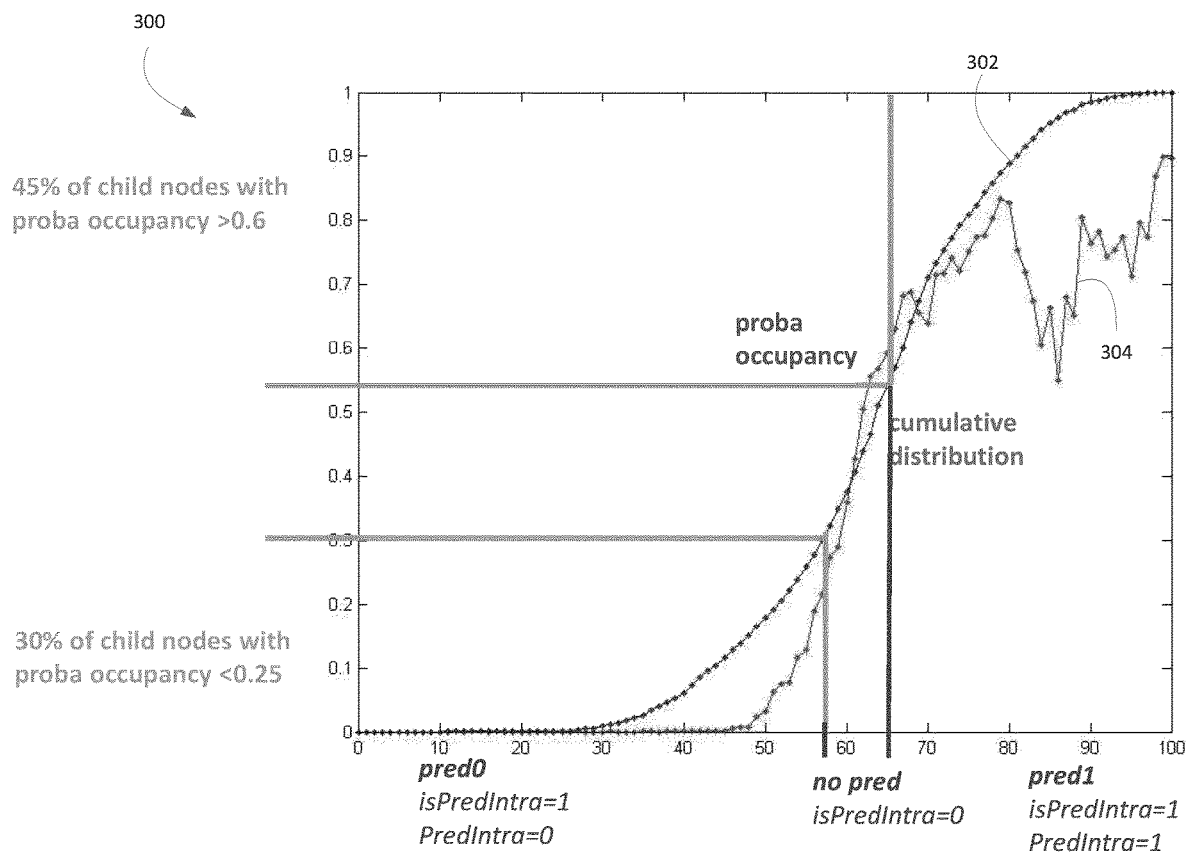
FIG. 13 shows a graph illustrating the effectiveness of a neighbourhood-based occupancy score in predicting child node occupancy.

Reference is now made to FIG. 13, which shows a graph 300 illustrating the effectiveness of a neighbourhood-based occupancy score in predicting child node occupancy. A cumulative distribution of scores for an example point cloud is shown by the points plotted and labelled 302. This shows the normalized cumulative number of child nodes having at least that score. It will be noted that the bulk of the nodes have scores ranging from about 40 to 90 on a scale of 0 to 128. Note that the graph has been cut for scores above 100 as they practically almost never happened and were statistically not relevant.

Also plotted on the graph is a probability of occupancy for a child node having that score, as indicated by reference number 304. This has been determined empirically based on test point cloud data.

It will be noted that there is a general fit between predictive occupancy score and probability of occupancy, but not a perfect fit; however, there is a consistent sharp transition, particularly in terms of the probability of occupancy, as the node transition between likely unoccupied and likely occupied. Accordingly, the predictive usefulness of the score has meaning in two portions of the graph: below a certain score the associated child node is likely unoccupied, and above a certain higher score the associated child node is likely occupied. Between those two scores, it is difficult to predict (from the score) whether the associated child node is occupied or not. That is, the score does not provide useful predictive information in the transition area.

Accordingly, based on the empirical data, two thresholds may be set—an upper threshold (th1) and a lower threshold (th0)—to demarcate those scores that may be used to predict occupancy and those score which are not useful for predicting occupancy. As a logic function:

if score <=th0, then predict non-occupied (pred0),
if score >=th1, then predict occupied (pred1),
otherwise, cannot decide (no pred)

The setting of suitable thresholds may be tuned based on empirical testing and may be varied depending on the nature of the content. The encoder may select thresholds and signal them to the decoder in the bitstream.

It has also been noted that the probability of occupancy is not only related to the score, i.e. information regarding neighbouring sub-volume occupancy, but is also correlated to the number of occupied neighbours that factor into the score. Accordingly, the thresholds may be selected in part based on the number of occupied neighbouring sub-volumes. In one embodiment, the encoder and decoder may store and use a LUT containing the threshold values for various numbers of occupied neighbouring sub-volumes. FIG. 14 shows one example LUT 350, $N_O$ is the number of occupied neighbours. As this example relates to octree-based coding, $N_O$ may range from 0 to 26, meaning the LUT contains a row of 27 entries specifying the corresponding lower threshold and a row of 27 entries specifying the corresponding upper threshold. The thresholds in this example are based on a score ranging from 0 to 128, as described in the above examples.

Figure 15:
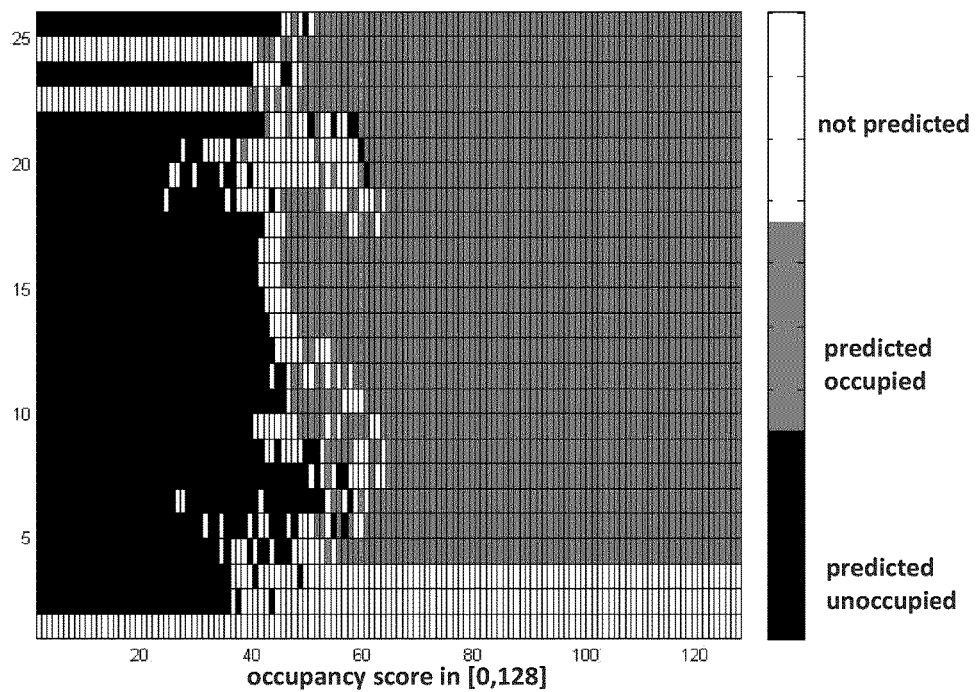
FIG. 15 illustrates the mapping of occupancy score and number of occupied neighbouring sub-volumes to a prediction status.

In another embodiment, the discrete (ternary) information can be deduced directly from the number of occupied neighbours $N_O$ and the occupancy score as shown in FIG. 15, which illustrates the mapping of occupancy score and number of occupied neighbouring sub-volumes to a prediction status (predicted unoccupied; predicted occupied; or not predicted). Practically, the encoder and decoder may use a two entry ($N_O$ and occupancy score) table that outputs a ternary value.

Figure 16:
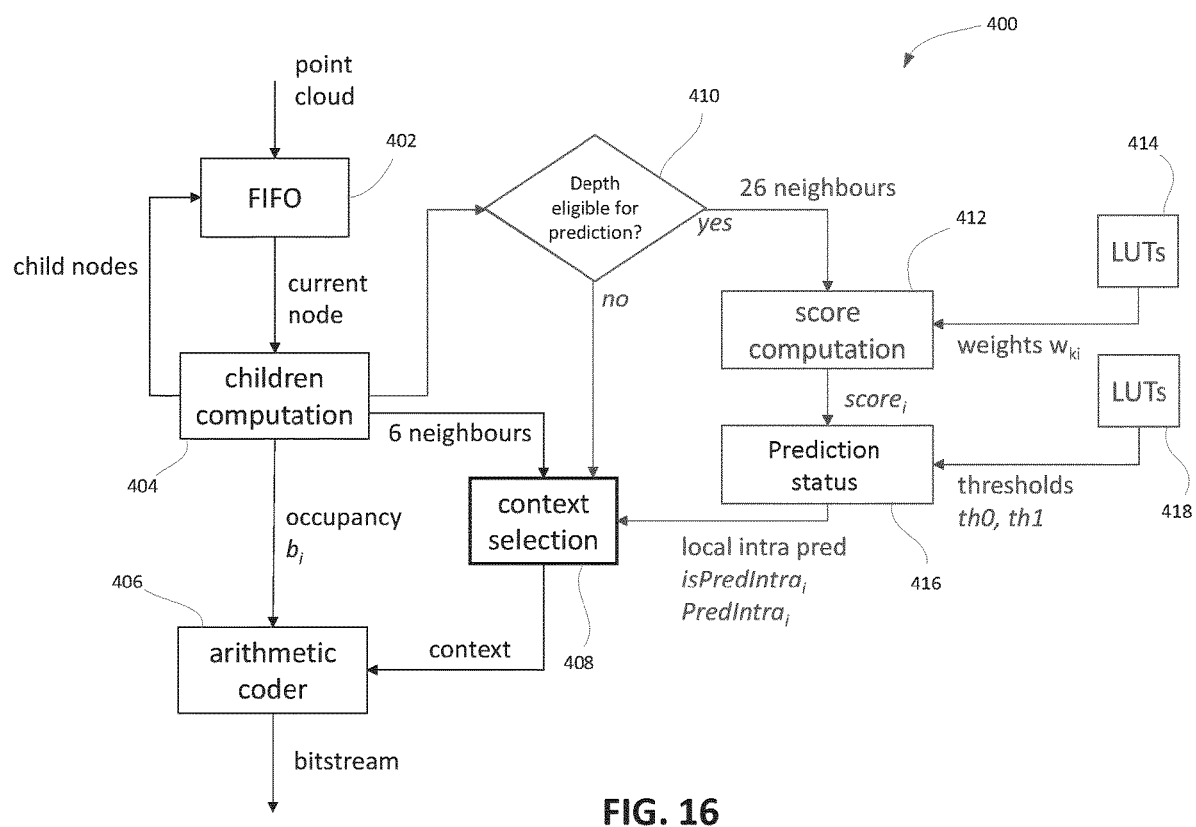
FIG. 16 shows a block diagram of an example encoder for point cloud data.

Reference is now made to FIG. 16, which shows a block diagram of an example encoder 400 for point cloud data. The encoder 400 includes a FIFO buffer 402 for holding point cloud data, such as the geographic location data for points within a volume. As described above, the volume is recursively partitioned into sub-volumes in accordance with a tree-based coding structure, such as an octree. For a current sub-volume, i.e. a current node, the encoder 400 determines child occupancy through further partitioning of the sub-volume into child sub-volumes, as indicated by reference numeral 404. The occupancy pattern for the sub-volume, which indicates the occupancy of each child sub-volume using an occupancy bit $b_i$, is arithmetically coded using an arithmetic coder 406 to produce the bitstream of encoded point cloud data.

To better compress the point cloud data, the arithmetic coder 406 employs context-adaptive coding. The context for coding a bit is supplied by a context selector 408. The context selector 408 selects from available contexts based, in part, on neighbourhood data. For example, as described above, the context selector 408 may select a context based on neighbour configuration using the six neighbouring sub-volumes that share a face with the current sub-volume.

In accordance with an aspect of the present application, the encoder 400 further employs neighbouring sub-volume occupancy data to determine a likely occupancy status for each child of the sub-volume and, on that basis, selects between three possible context sets, and then relies on neighbour configuration to select a context from within that selected context set. As a threshold operation, the encoder 400 may assesses whether the depth of the current node in the tree structure makes it eligible for occupancy prediction. In some implementations, resolution of the point cloud may be mean that the data will be too sparse at deep levels of the tree to usefully rely on occupancy prediction scores. It has been observed that the present technique works best with dense point cloud data that obviously contain more spatial correlation than sparse data. Accordingly, as indicated by reference numeral 410, the encoder 400 may evaluate depth of the coding as a pre-condition for enabling neighbourhood-based occupancy prediction for context set selection. In some implementations, the encoder may only enable prediction in cases whether the node is above a certain depth of the tree structure. In other implementation, other factors may be taken into account in assessing whether the current node is eligible.

If enabled, then, as indicated by reference numeral 412, the encoder 400 engages in score computation based on the occupancy status of neighbouring sub-volumes and respective weight values for each of the occupied neighbouring sub-volumes. The respective weight values $w_{ki}$ are indexed based on the neighbouring sub-volume (index k) and the child sub-volume (index i) being predicted. These may be obtained from a weights LUT 414.

Having computed an occupancy score for a child sub-volume using, for example, the sum of the weights of the occupied neighbouring sub-volumes averaged over the total number of neighbouring sub-volumes, then the encoder 400 converts the occupancy score to a prediction status for the child sub-volume, as shown by reference numeral 416. As described above, the prediction statuses in one example, may include (a) predicted occupied, (b) predicted unoccupied, and (c) not predicted. Determination of prediction status may be based on the occupancy score and an upper and lower threshold, as described above. In some cases, it may further be based on the number of occupied neighbouring sub-volumes. A second LUT 418 may be used to provide the upper and lower thresholds dependent upon the number of occupied neighbouring sub-volumes. In some cases, the second LUT 418 may provide the prediction status and is indexed using the occupancy score and the number of occupied neighbouring sub-volumes.

The determined prediction status is fed back to the context selector 408 where it is used as the basis for selecting a context set. In one example, the prediction status is one of three states and it is used to select between three mutually-exclusive context sets. Then the context selector 408 uses neighbour configuration or another technique to select a context from within the selected context set for coding the occupancy bit of the associated child node.

As discussed above, the improved context selection through use of weighted neighbouring sub-volume occupancy information in selecting a context for coding the occupancy bit associated with a child node results in greater compression of the point cloud occupancy data, which has advantages including lower storage requirements and lower bandwidth transmission requirements, without any loss of fidelity.

In some examples, the prediction status may have more than three categories. For example, the prediction status (using suitable thresholds) may be classified as (a) strongly predicted occupied, (b) weakly predicted occupied), (c) not predicted, (d) weakly predicted unoccupied, and (e) strongly predicted unoccupied.

In yet another example, when the prediction status is either (a) strongly predicted occupied or (e) strongly predicted unoccupied, the confidence in the predicted occupancy is so high that the coded occupancy may directly be inferred by the status without any extra coding at the risk of creating some distortion in the coded point cloud relatively to the original point cloud. This is particularly advantageous for nodes associated with 2×2×2 cubes because, even if the predictor is wrong, this would only impact the location of one point and not create a wrong underlying sub-tree.

Figure 17:
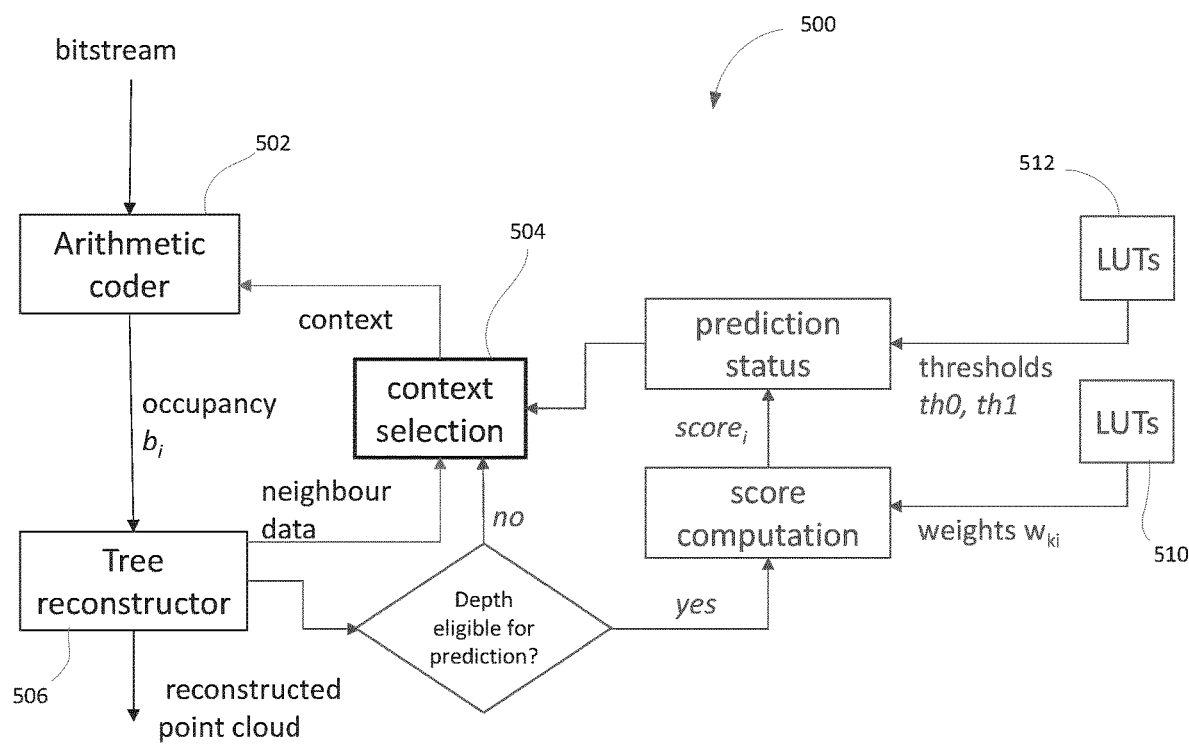
FIG. 17 shows a block diagram of an example decoder for point cloud data.

Reference is now made to FIG. 17, which shows an example of a point cloud decoder 500 for decoding a bitstream of compressed occupancy data. The decoder 500 includes an arithmetic coder 502 that receives a selected context from a context selector 504 for decoding an occupancy bit $b_i$ associated with a child node to a current node. The decoded occupancy bit is used by a tree reconstructor 506 that rebuilds the tree-structure of the point cloud to produce output occupancy data providing the location of points in the reconstructed point cloud.

The context selection process mirrors that in the encoder 400 of FIG. 16. That is, the decoder 500 assesses whether the current node is eligible for neighbour-based child occupancy prediction. In one example, eligibility is based on depth of the current node in the tree structure. If eligible, then the decoder 500 determines the score for the child node from the above-described process taking into account the neighbouring sub-volume occupancy and weights from a weight LUT 510. That score is used to determine a prediction status, partly based on a second LUT 512 that may, in some cases, contain thresholds. The thresholds selected may be based on the number of occupied neighbouring sub-volumes. The prediction status is then used in selecting a context set, and the context selector 504 then selects a context from within that selected context set for decoding the occupancy bit corresponding to the i-th child node.

It will be appreciated that the present context set selection process described in the above examples integrates well with other context selection processes, whether they involve neighbour configuration, previously-coded occupancy pattern bits, or context reduction operations.

Figure 18:
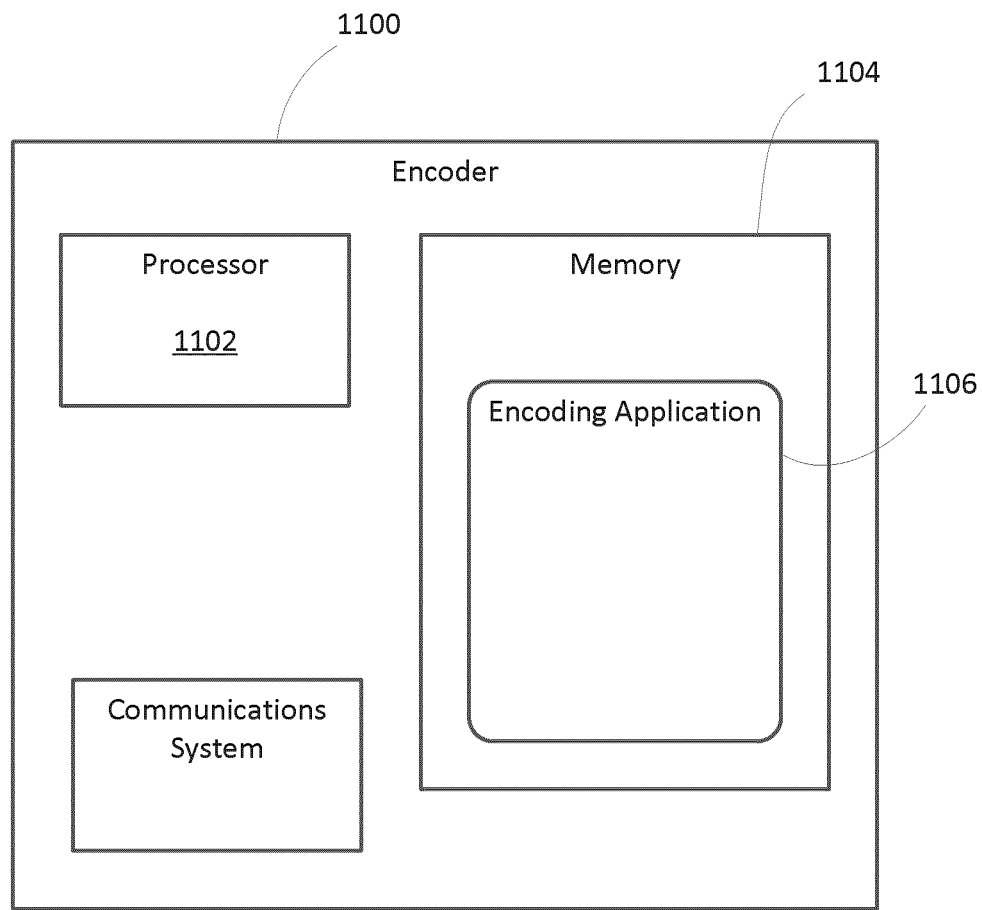
FIG. 18 shows an example simplified block diagram of an encoder.

Reference is now made to FIG. 18, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 19:
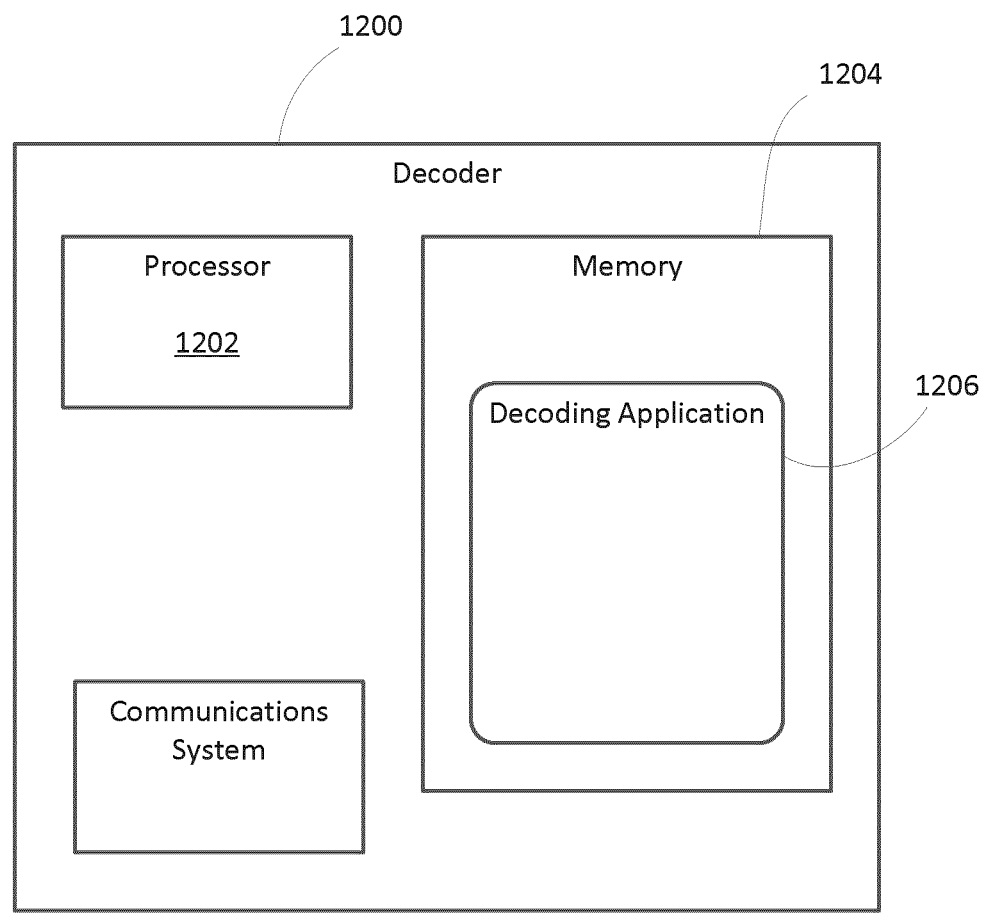
FIG. 19 shows an example simplified block diagram of a decoder.

Reference is now also made to FIG. 19, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Impact on Compression Performance

In testing, using an MPEG virtual reality test model entitled "longdress", one implementation of the above-described context set selection process resulted in a gain of about 10% for lossless coding efficiency (compression).

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data representing a three-dimensional location of a physical object, the point cloud being located within a volumetric space recursively split into sub-volumes and containing points of the point cloud, each of the points having a geometric location within the volumetric space, wherein an occupancy bit associated with each respective sub-volume indicates whether that respective sub-volume contains at least one of the points, the method comprising:

determining an occupancy score for each child sub-volume of a parent sub-volume, where each occupancy score is based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume;

for each child sub-volume of the parent sub-volume, context-adaptively entropy encoding occupancy data for the child sub-volume based, at least in part, on its occupancy score to generate a bitstream; and outputting the bitstream of compressed point cloud data.

2. The method claimed in claim 1, wherein determining an occupancy score includes summing the respective weights of each of the neighbouring sub-volumes that is occupied to obtain a sum, and dividing the sum by the number of neighbouring sub-volumes.

3. The method claimed in claim 1, wherein determining the occupancy score includes determining the occupancy score based on $$score_i = \frac{1}{N}\sum_{k=1}^{N} w_{k,i}(\delta_k),$$

where i is an index to the child sub-volumes, $score_i$ is the occupancy score for the i-th child sub-volume, k is an index to the neighbouring sub-volumes, N is a total number of neighbouring sub-volumes, $w_{k,i}$ is the respective weight assigned to the k-th neighbouring sub-volume vis-à-vis the i-th child sub-volume, and $\delta_k$ is an occupancy status of the k-th neighbouring sub-volume that is 0 if the k-th neighbouring sub-volume is unoccupied and is 1 if the k-th neighbouring sub-volume is occupied.

4. The method claimed in claim 1, wherein determining the occupancy score further includes obtaining the respective weights from a weights look-up table stored in memory.

5. The method claimed in claim 1, wherein context-adaptively entropy encoding occupancy data for the child sub-volume includes:

selecting a context, based on the occupancy score for that child sub-volume, for coding the occupancy bit associated with that child sub-volume, and context-adaptively entropy coding that occupancy bit based on the selected context to generate the bitstream.

6. The method claimed in claim 5, wherein selecting a context includes selecting a context set from among two or more available mutually-exclusive context sets based upon the occupancy score, each of the two or more available mutually-exclusive context sets containing two or more contexts, and then selecting the context from the selected context set.

7. The method claimed in claim 6, wherein selecting the context from the selected context set includes selecting the context based on neighbour configuration.

8. The method claimed in claim 5, wherein determining an occupancy score for each child sub-volume further includes determining a prediction status for each child sub-volume, and wherein the prediction statuses include occupied, unoccupied, or no-prediction, and wherein, for each child sub-volume, selecting a context includes selecting a context set from among two or more available mutually-exclusive context sets based upon the prediction status determined for that child sub-volume.

9. The method claimed in claim 8, wherein determining a prediction status includes comparing the occupancy score to a lower threshold and to an upper threshold, and wherein the prediction status is determined to be occupied if the occupancy score is above the upper threshold, is determined to be unoccupied if the occupancy score is below the lower threshold, and is determined to be no-prediction otherwise, and optionally, further including selecting the upper and lower thresholds based upon the number of neighbouring sub-volumes that are occupied, and optionally, further including obtaining the upper and lower thresholds from a thresholds look-up table stored in memory.

10. The method claimed in claim 1, wherein the plurality of neighbouring sub-volumes neighbouring the parent sub-volume include sub-volumes that share a face, an edge or a vertex with the parent sub-volume.

11. An encoder for encoding a point cloud to generate a bitstream of compressed point cloud data, the point cloud being located within a volumetric space recursively split into sub-volumes and containing points of the point cloud, each of the points having a geometric location within the volumetric space, wherein an occupancy bit associated with each respective sub-volume indicates whether that respective sub-volume contains at least one of the points, the encoder comprising:

a processor;

memory; and an encoding application containing instructions executable by the processor that, when executed, cause the processor to:

determine an occupancy score for each child sub-volume of a parent sub-volume, where each occupancy score is based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume;

for each child sub-volume of the parent sub-volume, context-adaptively entropy encode occupancy data for the child sub-volume based, at least in part, on its occupancy score to generate a bitstream; and output the bitstream of compressed point cloud data.

12. A decoder for decoding a bitstream of compressed point cloud data to produce a reconstructed point cloud, the point cloud being located within a volumetric space recursively split into sub-volumes and containing the points of the point cloud, each of the points having a geometric location within the volumetric space, wherein an occupancy bit associated with each respective sub-volume indicates whether that respective sub-volume contains at least one of the points, the decoder comprising:

a processor;

memory; and a decoding application containing instructions executable by the processor that, when executed, cause the processor to:

determine an occupancy score for each child sub-volume of a parent sub-volume, where each occupancy score is based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume;

for each child sub-volume of the parent sub-volume, context-adaptively entropy decode the bitstream based, at least in part, on the occupancy score for that child sub-volume to reconstruct the occupancy data for that child sub-volume; and output the reconstructed point cloud.

13. A method of decoding a bitstream of compressed point cloud data to produce a reconstructed point cloud representing a three-dimensional location of a physical object, the point cloud being located within a volumetric space recursively split into sub-volumes and containing the points of the point cloud, each of the points having a geometric location within the volumetric space, wherein an occupancy bit associated with each respective sub-volume indicates whether that respective sub-volume contains at least one of the points, the method comprising:

reconstructing the points of the point cloud by reconstructing the occupancy bits by determining an occupancy score for each child sub-volume of a parent sub-volume, where each occupancy score is based on the occupancy status of a plurality of neighbouring sub-volumes neighbouring the parent sub-volume and a respective weight assigned to each of the neighbouring sub-volumes vis-à-vis that child sub-volume, and wherein the respective weight reflects a strength of correlation between occupancy of that neighbouring sub-volume and occupancy of that child sub-volume;

for each child sub-volume of the parent sub-volume, context-adaptively entropy decoding the bitstream based, at least in part, on the occupancy score for that child sub-volume to reconstruct the occupancy data for that child sub-volume; and outputting the reconstructed point cloud.

14. The method claimed in claim 13, wherein determining an occupancy score includes summing the respective weights of each of the neighbouring sub-volumes that is occupied to obtain a sum, and dividing the sum by the number of neighbouring sub-volumes.

15. The method claimed in claim 13, wherein determining the occupancy score includes determining the occupancy score based on $$score_i = \frac{1}{N}\sum_{k=1}^{N} w_{k,i}(\delta_k),$$

where i is an index to the child sub-volumes, $score_i$ is the occupancy score for the i-th child sub-volume, k is an index to the neighbouring sub-volumes, N is a total number of neighbouring sub-volumes, $w_{k,i}$ is the respective weight assigned to the k-th neighbouring sub-volume vis-à-vis the i-th child sub-volume, and $\delta_k$ is an occupancy status of the k-th neighbouring sub-volume that is 0 if the k-th neighbouring sub-volume is unoccupied and is 1 if the k-th neighbouring sub-volume is occupied.

16. The method claimed in claim 13, wherein determining the occupancy score further includes obtaining the respective weights from a weights look-up table stored in memory.

17. The method claimed in claim 13, wherein context-adaptively entropy decoding the bitstream includes:

selecting a context, based on the occupancy score for that child sub-volume, for decoding the occupancy bit associated with that child sub-volume, and context-adaptively entropy decoding that occupancy bit based on the selected context to the occupancy bit.

18. The method claimed in claim 17, wherein selecting a context includes selecting a context set from among two or more available mutually-exclusive context sets based upon the occupancy score, each of the two or more available mutually-exclusive context sets containing two or more contexts, and then selecting the context from the selected context set.

19. The method claimed in claim 18, wherein selecting the context from the selected context set includes selecting the context based on neighbour configuration.

20. The method claimed in claim 17, wherein determining an occupancy score for each child sub-volume further includes determining a prediction status for each child sub-volume, and wherein the prediction statuses include occupied, unoccupied, or no-prediction, and wherein, for each child sub-volume, selecting a context includes selecting a context set from among two or more available mutually-exclusive context sets based upon the prediction status determined for that child sub-volume.

21. The method claimed in claim 20, wherein determining a prediction status includes comparing the occupancy score to a lower threshold and to an upper threshold, and wherein the prediction status is determined to be occupied if the occupancy score is above the upper threshold, is determined to be unoccupied if the occupancy score is below the lower threshold, and is determined to be no-prediction otherwise, and optionally, further including selecting the upper and lower thresholds based upon the number of neighbouring sub-volumes that are occupied, and optionally, further including obtaining the upper and lower thresholds from a thresholds look-up table stored in memory.

22. The method claimed in claim 13, wherein the plurality of neighbouring sub-volumes neighbouring the parent sub-volume include sub-volumes that share a face, an edge or a vertex with the parent sub-volume.

* * * * *